United States Patent
Lee et al.

(10) Patent No.: US 7,623,389 B2
(45) Date of Patent: *Nov. 24, 2009

(54) SYSTEM FOR LOW VOLTAGE PROGRAMMING OF NON-VOLATILE MEMORY CELLS

(75) Inventors: Dana Lee, Saratoga, CA (US); Jeffrey Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 303 days.

This patent is subject to a terminal disclaimer.

(21) Appl. No.: 11/614,884

(22) Filed: Dec. 21, 2006

(65) Prior Publication Data

US 2008/0151628 A1    Jun. 26, 2008

(51) Int. Cl.
*G11C 16/06* (2006.01)
(52) U.S. Cl. .................. 365/185.23; 365/185.03; 365/185.28; 365/185.21; 365/185.18
(58) Field of Classification Search ............ 365/185.23, 365/185.03, 185.28, 185.21, 185.18
See application file for complete search history.

(56) References Cited

U.S. PATENT DOCUMENTS

| | | | |
|---|---|---|---|
| 6,529,410 B1 | 3/2003 | Han et al. | |
| 6,822,909 B1 * | 11/2004 | Hamilton et al. | ....... 365/185.28 |
| 6,894,924 B2 | 5/2005 | Choi et al. | |
| 6,992,929 B2 | 1/2006 | Chen et al. | |
| 7,002,843 B2 * | 2/2006 | Guterman et al. | ....... 365/185.03 |
| 7,057,940 B2 | 6/2006 | Hsu et al. | |
| 7,259,992 B2 * | 8/2007 | Shirota | .................. 365/185.21 |
| 7,460,405 B2 | 12/2008 | Yoshino | |
| 2004/0080980 A1 * | 4/2004 | Lee | ........................ 365/185.17 |
| 2008/0084761 A1 | 4/2008 | Lee et al. | |
| 2008/0151627 A1 * | 6/2008 | Lee et al. | ............... 365/185.15 |
| 2009/0021987 A1 * | 1/2009 | Sarin et al. | ............. 365/185.21 |

FOREIGN PATENT DOCUMENTS

WO    WO 02/096632    12/2002

OTHER PUBLICATIONS

International Search Report dated Jun. 25, 2008 in PCT Application No. PCT/US2007/087481.
Written Opinion dated Jun. 25, 2008 in PCT Application No. PCT/US2007/087481.
Jae-Duk Lee et al., "A New Programming Disturbance Phenomenon in NAND Flash Memory By Source/Drain Hot-Electrons Generated By GIDL Current," Proceedings of IEEE 21$^{st}$ Non-Volatile Memory Semiconductor Workshop p. 31 (2006).

(Continued)

*Primary Examiner*—Connie C Yoha
(74) *Attorney, Agent, or Firm*—Davis Wright Tremaine LLP

(57) ABSTRACT

System for programming a selected non-volatile memory cell in a memory array having a gate node coupled to a wordline WL(n) and a drain node connected to a selected bitline by injecting hot carriers from a drain region of an injecting memory cell having a gate node coupled to a next neighbor wordline WL(n−1) into a floating gate of the selected non-volatile memory cell on the wordline WL(n).

17 Claims, 11 Drawing Sheets

OTHER PUBLICATIONS

Yoocheol Shin et al., "A Novel NAND-type MONOS Memory using 63nm Process Technology for Multi-Gigabit Flash EEPROMs," IEDM Tech. Digest p. 337 (2005).

Ken'ichiro Sonoda et al., "Compact Modeling of Source-Side Injection Programming for 90nm-Node AG-AND Flash Memory," Int'l Conf. on Simulation of Semiconductor Processes and Devices, p. 123 (2005).

Dana Lee et al., "Vertical floating-gate 4.5$F^2$ Split-gate NOR Flash Memory at 110nm Node," Digest of Technical Papers, 2004 Symposium on VLSI Technology (2004).

Cheng-Yuan Hsu et al., "Split-Gate NAND Flash Memory at 120nm Technology Node Featuring Fast Programming and Erase," Digest of Technical Papers, 2004 Symposium on VLSI Technology (2004).

Office Action for U.S. Appl. No. 11/614,879 mailed Apr. 17, 2009, 14 pages.

* cited by examiner

| Step | 0 | 1 | 2 | 3 | 4 | 5 | 6 | 7 | 8 | 9 |
|---|---|---|---|---|---|---|---|---|---|---|
| Uns BL | 0 | Vdd | Vdd | Vdd | Vdd | Vdd | Vdd | Vdd | Vdd | Vdd |
| Sel BL | 0 | 0 | 0 | 0 | 0 | float | charge | charge | 0 | 0 |
| SGD | 0 | 0 | Vsgd [Vt] | Vsgd [Vt] | Vsgd [Vt] | Vsgd [Vt] | Vsgd [Vt] | Vsgd [Vt] | 0 | 0 |
| WL(low) | 0 | 0 | VpassL | VpassL | VpassL | VpassL | VpassL | VpassL | 0 | 0 |
| WL(n-1) | 0 | 0 | 0 | 0 | 0 | 0 | 0 | sweep to 3V | 0 | 0 |
| WL(n) | 0 | 0 | VpassL | VpassH | Vpgm | Vpgm | Vpgm | Vpgm | 0 | 0 |
| WL(high) | 0 | 0 | VpassL | VpassH | VpassH | VpassH | VpassH | VpassH | 0 | 0 |
| SGS | 0 | 0 | 0 | 0 | 0 | Vdd | Vsgs (HV) | Vsgs (HV) | 0 | 0 |
| SL | 0 | 0 | 0 | 0 | 0 | Vpp | Vpp | Vpp | Vdd | 0 |
| Energy | | ½(N*Cbl*Vdd²) | | | | ½(Csl*Vpp²) | | | | |
| Comment | | | | | | | Start programming. | Program positive Vt's | | |

Fig. 6

| Step | 0 | 1 | 2 | 3 | 4 | 5 | 6 | 7 | 8 |
|---|---|---|---|---|---|---|---|---|---|
| Uns BL | 0 | 0 | 0 | 0 | 0 | 0 | 0 | 0 | 0 |
| Sel BL | 0 | 0 | Vpp [5V] | Vpp [5V] | Vpp [5V] | discharge | discharge | 0 | 0 |
| SGD | 0 | 0 | 0 | Vsgd [8V] | Vsgd [8V] | Vsgd [8V] | Vsgd [8V] | Vsgd [8V] | 0 |
| WL(high) | 0 | 0 | 0 | VpassH | VpassH | VpassH | VpassH | VpassH | 0 |
| WL(n) | 0 | 0 | 0 | Vpgm | Vpgm | Vpgm | Vpgm | Vpgm | 0 |
| WL(n-1) | 0 | 0 | 0 | 0 | 0 | 0 | sweep to 3V | sweep to 3V | 0 |
| WL(low) | 0 | 0 | 0 | VpassL | VpassL | VpassL | VpassL | VpassL | 0 |
| SGS | 0 | 0 | 0 | Vsgs [Vdd] | Vsgs [Vdd] | Vsgs [Vdd] | Vsgs [Vdd] | Vsgs [Vdd] | 0 |
| SL | 0 | Vdd | Vdd | Vdd | Vdd | 0 | 0 | 0 | 0 |
| Energy | | ½(Csl*Vdd²) | ½(N*Cbl*Vpp²) | | | | | | |
| Comment | | | | | | Start programming for negative Vt's | Program positive Vt's | done | |

Fig. 9A

SYSTEM FOR LOW VOLTAGE PROGRAMMING OF NON-VOLATILE MEMORY CELLS

CROSS REFERENCE TO RELATED APPLICATIONS

This application is related to co-pending patent application titled, "HYBRID PROGRAMMING METHODS AND SYSTEMS FOR NON-VOLATILE MEMORY STORAGE ELEMENTS" by Lee et al. filed Sep. 26, 2006 having application Ser. No. 11/535,452 that is incorporated by reference in its entirety for all purposes. This application is also related to co-pending patent application titled, "METHOD OF LOW VOLTAGE PROGRAMMING OF NON-VOLATILE MEMORY CELLS" by Lee et al. filed Dec. 21, 2006 having application Ser. No. 11/614,879 that is incorporated by reference in its entirety for all purposes.

FIELD OF THE INVENTION

The present invention relates generally to technology for programming memory devices. More particularly, the present invention relates to low voltage programming scheme using source side injection.

BACKGROUND

Non-volatile semiconductor memory devices, and in particular flash memory devices, are becoming increasingly popular means of storage for small devices such as digital cameras, MP3 players, cellular telephones, personal digital assistants (PDAs), laptop computers, etc. Other forms of non-volatile memory include EPROM (Electrically Programmable Read Only Memory) and EEPROM (Electrically Erasable and Programmable Read Only Memory).

Unlike standard MOS transistors, flash memory cell transistors contain a floating gate that is electrically isolated and located between a control gate and typically a p-type substrate. Programming of a memory cell results in raising the threshold value of the transistor to a positive value as a result of electrons being injected through the insulating dielectric layer into the floating gate. Conversely, erasing results in lowering the threshold value of the transistor to a negative value as a result of electrons being removed from the floating gate. In this manner, the threshold value of the memory cell indicates its corresponding logic state. Programming is generally accomplished by using one of three major mechanisms: Fowler-Nordheim (FN) tunneling, source side [hot-electron] injection (SSI) and channel, or substrate, hot-electron injection (CHEI or SHEI).

When programming a memory cell string, there are various disturb mechanisms that tend to result in unintentional programming or erase. This problem is of particular concern when trying to program one cell on a wordline without programming the other cells on the same wordline. Since the program voltage is applied to all of the cells on a wordline during the programming of a selected cell, there exists a possibility that unselected cells may become inadvertently programmed (or erased) as well. Furthermore, the higher electric fields resulting as devices are scaled down in size and the source and drain junctions become more abrupt can lead to disturbs such as drain junction breakdown resulting in Gate Induced Drain Leakage (GIDL) whereby electrons leak into the boosted channel, and in particular, into the drain junction. Additionally, high electric fields can also lead to unintentional programming of unselected cells through FN tunneling, SSI and CHEI.

Various techniques, such as self boosting, local self boosting (LSB), and erased area self boosting (EASB), have improved the inhibition of program disturb, but still suffer from their own problems and fail to prevent program disturb in all instances. For example, in EASB, if the voltage applied to unselected wordlines is too low, channel boosting can be insufficient to prevent program disturb. Conversely, if this voltage is too high, there will be unintentional programming of memory cells on unselected wordlines as a result of tunneling. The three aforementioned techniques (and others known but not described herein) also suffer from a disturb mechanism that depends on whether or not the source-side neighbor cell is programmed. For example, if the source-side neighboring cell is programmed, it will have a negative charge on the floating gate. Since the control gate of the source side neighbor is at 0V, a highly reverse biased junction is created under the gate. This can lead to the phenomenon of GIDL resulting in a reduced boost potential, which can eventually lead to program disturb (in this case erasure). Conversely, if the source-side neighbor is erased, its threshold voltage is likely negative and the transistor of the cell may not turn off.

These programming problems, and others, become even more problematic for both selected and inhibited cells as NAND memory devices scale down to smaller geometries due to, in part, the stresses on gates and channels due to high voltages and the resultant high electric fields. Typical NAND memory fabricators attempt to manage the high voltages and electric fields using a number of approaches such as tightening distributions, selective non-scaling of certain features, or the introduction of exotic materials. Still other approaches utilize source side injection at low voltages that, unfortunately, require large memory cells, complicated fabrication processes, or both.

Therefore, what is required is a low voltage non-volatile memory programming protocol and system.

SUMMARY

To achieve the foregoing and other objects of the invention, a low voltage method of programming a non-volatile memory cell is described. The low voltage programming method described is a more robust protocol suitable for reliably programming selected memory cells while eliminating programming disturbs.

In one aspect of the invention, a system for providing low voltage programming of a selected non-volatile memory cell in a memory array having a gate node coupled to a wordline WL(n) and a drain node connected to a selected bitline is described that includes a programming module, an interface arranged to electrically couple the memory array to the programming module, and a processor included in the programming module and electrically coupled to the interface for executing programming instructions that cause hot carriers to be injected from a drain region of an injecting memory cell having a gate node coupled to a next neighbor wordline WL(n−1) into a floating gate of the selected non-volatile memory cell on the wordline WL(n).

In one embodiment, Vpgm is applied to the selected word line WL(n), the selected bitline is held at ground, a high passing voltage VpassH is applied to all unselected wordlines except for the next neighbor word line WL(n−1), the high passing voltage VpassH is also applied to a source gate select (SGS) line, all unselected bitlines are grounded, high voltage Vpp is applied to a common source line, and a next neighbor word line WL(n−1) gate node voltage is swept from about 0 V to about a Vread V.

In another embodiment, Vpgm is applied to the selected word line WL(n), the selected bitline is held at Vpp, a high passing voltage VpassH is applied to all unselected wordlines except for the next neighbor word line WL(n−1), the high passing voltage VpassH is also applied to a drain gate select (SGD) line, all unselected bitlines are grounded, a common source line is grounded, and a next neighbor word line WL(n−1) gate node voltage is swept from about 0 V to about a Vread V.

In another aspect of the invention, a system for providing low voltage programming of a selected non-volatile memory cell in a memory array having a gate node coupled to a wordline WL(n) and a drain node connected to a selected bitline, includes at least a programming module; an interface arranged to electrically couple the memory array to the programming module; and a processor included in the programming module and electrically coupled to the interface for executing programming instructions only if a threshold voltage of the selected non-volatile memory cell is less than a target threshold voltage that include holding the selected bitline at ground, applying $V_{dd}$ to all unselected bitlines; applying low passing voltage $V_{passL}$ to SGD line, applying $V_{pp}$ to common source line, applying a high passing voltage $V_{passH}$ to all unselected wordlines except for the next neighbor word line WL(n−1), applying the high passing voltage $V_{passH}$ to a source gate select (SGS) line, applying $V_{pgm}$ to the selected word line WL(n), and sweeping a next neighbor word line WL(n−1) gate node voltage from about 0 V to about a $V_{read}$ thereby causing hot carriers to be injected from a drain region of an injecting memory cell having a gate node coupled to a next neighbor wordline WL(n−1) into a floating gate of the selected non-volatile memory cell on the wordline WL(n), otherwise, if the threshold voltage is greater than an target threshold voltage, the non-volatile memory cell is locked out.

In yet another aspect of the invention, a system for providing low voltage programming of a selected non-volatile memory cell in a memory array having a gate node coupled to a wordline WL(n) and a drain node connected to a selected bitline, includes at least a programming module; an interface arranged to electrically couple the memory array to the programming module; and a processor included in the programming module and electrically coupled to the interface for executing programming instructions only if a threshold voltage of the selected non-volatile memory cell is less than a target threshold voltage that include holding the selected bitline at $V_{pp}$, grounding to all unselected bitlines, applying high passing voltage VpassH to SGD line and unselected wordlines except for the next neighbor wordline WL(n−1), applying low passing voltage $V_{passL}$ to SGS line; grounding common source line, applying $V_{pgm}$ to the selected word line WL(n), and sweeping a next neighbor word line WL(n−1) gate node voltage from about 0 V to about a $V_{read}$ when the threshold voltage is less than the target voltage thereby causing hot carriers to be injected from a drain region of an injecting memory cell having a gate node coupled to a next neighbor wordline WL(n−1) into a floating gate of the selected non-volatile memory cell on the wordline WL(n), otherwise, if the threshold voltage is greater than an target threshold voltage, the non-volatile memory cell is locked out.

In the described embodiments the non-volatile memory cell is one of a number of non-volatile memory cells arranged to form a non-volatile memory array suitable for storing data. The non-volatile memory array is arranged in a NAND-type memory array architecture having a number of wordlines and bitlines. Additionally, the described method is contemplated for use on a multilevel type memory array that when programmed stores data in the form of at least one lower page and at least one associated upper page.

BRIEF DESCRIPTION OF THE DRAWINGS

The invention, together with further objects and advantages thereof, may best be understood by reference to the following description taken in conjunction with the accompanying drawings.

FIG. 6 illustrates a representative low voltage programming voltage bias values in accordance with the embodiment of the invention described in FIGS. 4 and 5.

FIGS. 9A and 9B illustrates representative low voltage programming waveforms in accordance with the embodiment of the invention described with regards to FIGS. 7 and 8.

In the drawings, like reference numerals designate like structural elements. Also, it should be understood that the depictions in the figures are not to scale.

DETAILED DESCRIPTION

In the following description, numerous specific details are set forth in order to provide a thorough understanding of the present invention. It will be apparent, however, to one skilled in the art that the present invention may be practiced without some or all of these specific details. In the description below, a memory cell is programmed using a next neighbor wordline as an injector for providing hot carriers. The objective is to use low voltage biasing to prevent and therefore substantially eliminate programming problems related to high voltage, small geometries, and resultant high electric fields.

Figure 1:
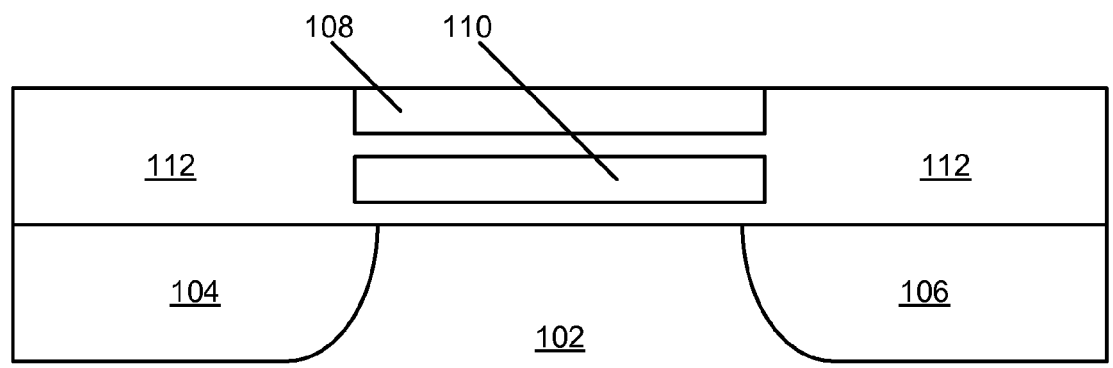
FIG. 1 illustrates an exemplary MOSFET having a floating gate.
Figure 2:
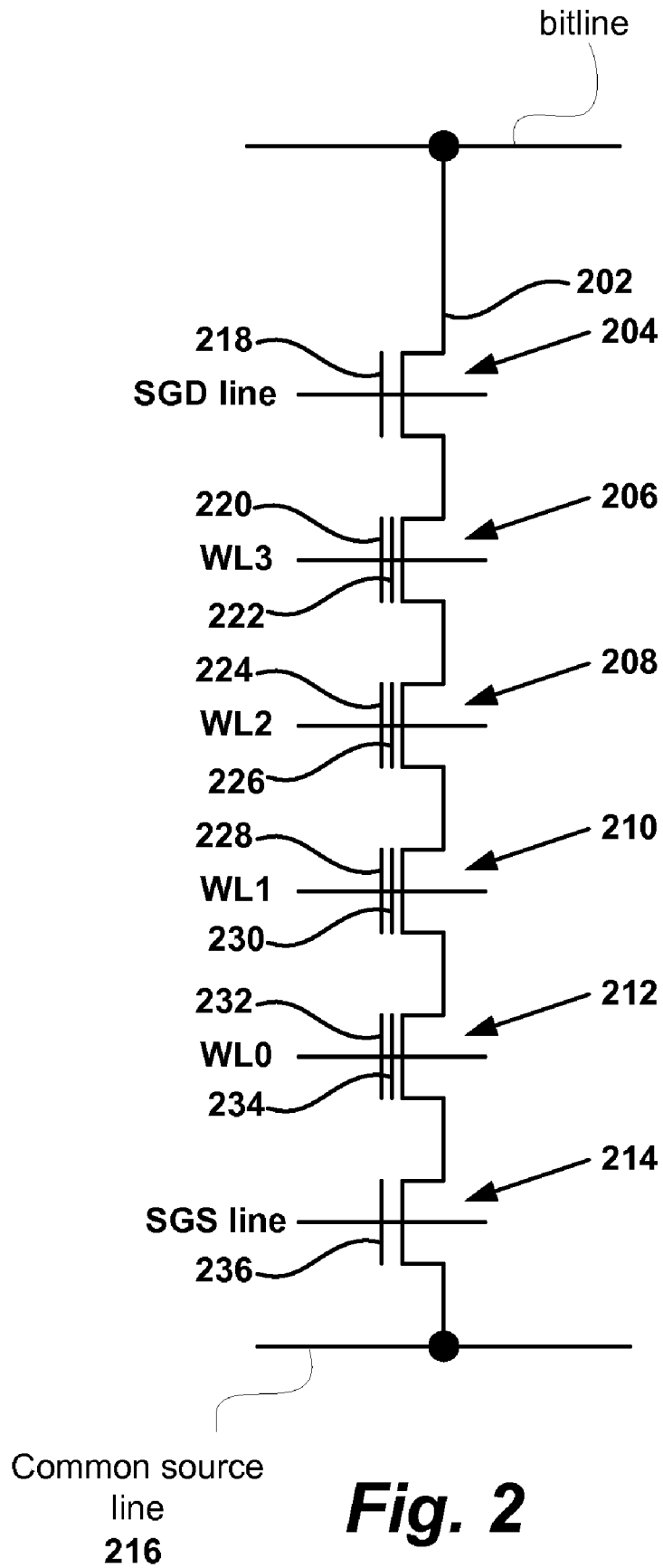
FIG. 2 illustrates an exemplary non-volatile memory string.
Figure 3:
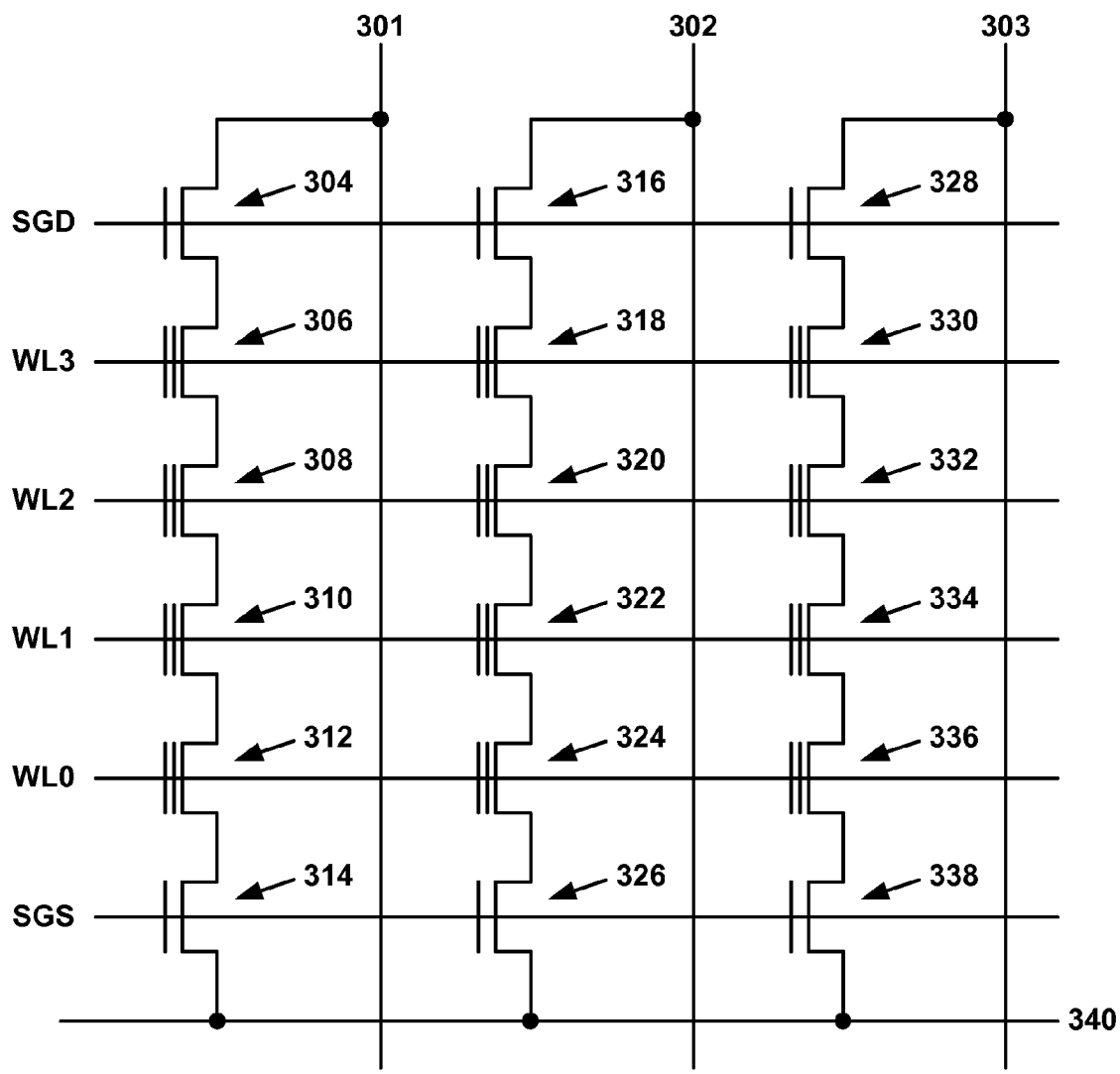
FIG. 3 illustrates an exemplary non-volatile memory array.

With reference to FIGS. 1, 2 and 3 a representative non-volatile memory storage array will be described. In the described embodiment, the non-volatile memory storage system is a flash memory chip having a NAND architecture, although the present invention is applicable to other forms of non-volatile memory including EPROM and EEPROM, and additionally to NOR architectures as well. In the described embodiment, the array consists of non-volatile memory storage elements that are p-type substrate floating gate MOSFETs. FIG. 1 illustrates a representative floating gate MOSFET, such as that used in this architecture, having a substrate 102, a source 104, a drain 106, a control gate 108, a floating gate 110, and a dielectric 112 surrounding the floating gate.

In NAND flash memory, a number of such transistors, also known hereafter as cells, memory cells or memory storage elements, are arranged in series. On either side of the series of memory cells is an additional transistor known as a select transistor, or gate. Collectively, the memory cells and two select gates are referred to as a NAND string. By way of illustration, the equivalent circuit of a 4-transistor NAND string is illustrated in FIG. 2. The four memory cells are labeled 206, 208, 210 and 212. The first select gate 204, referred to as the select gate drain (SGD), connects the NAND string to bitline 202. The second select gate 214, referred to as the select gate source (SGS), connects the NAND string to source line 216. Select gates 204 and 214 are controlled by control gates 218 and 236, respectively. An SGD line controls the control gate 218 for the select gate 204, while an SGS line controls the control gate 236 for the select gate 214. The four series transistors 206-212 each have both a control gate and a floating gate. For example, transistor 206 has a control gate 220 and a floating gate 222; transistor 208 has a control gate 224 and a floating gate 226; transistor 210 has a control gate 228 and a floating gate 230; and transistor 212 has a control gate 232 and a floating gate 234. Control gates 220, 224, 228 and 232 are connected to wordlines WL(3), WL(2), WL(1) and WL(0), respectively. It should be noted that although the example provided describes a NAND string that includes four memory cells, other numbers of cells may be arranged in series and are permissible as well.

FIG. 3 illustrates an example of a NAND string array showing three NAND strings 301, 302 and 303 of a memory array having many more NAND strings not shown. Like the string of FIG. 2, each of the NAND strings of FIG. 3 includes two select gates and four memory cells. For example, NAND string 301 includes select gates 304 and 314 as well as memory cells 306, 308, 310 and 312. Similarly, NAND string 302 includes select gates 316 and 326 as well as memory cells 318, 320, 322 and 324. Finally, NAND string 303 includes select gates 328 and 338 as well as memory cells 330, 332, 334 and 336. It should be noted that all control gates in a given row, or wordline, are connected. For example, WL0 connects the control gates of memory cells 312, 324 and 336. Each of the NAND strings are also connected to the same source line 340 via select gates 314, 326 and 338. The SGS line controls the source side select gates 314, 326, and 338, while the SGD line controls the select gates 304, 316 and 328, which connect the NAND strings to their respective bitlines.

While it is desired that the programming operation proceed as fast as possible, it is also desired that the Vt distributions be tight (narrow) such that a wider read margin (distance between the distributions) is obtained. It should also be noted that if multiple effects such as SSI, GIDL or SHEI occur, these effects are cooperative. That is, SSI, GIDL, and SHEI all move the selected distributions in the same direction. Therefore, even in the presence of multiple effects, unanticipated disturb will not occur. At most, these effects would cause variations in the programming rate. Furthermore, since the unselected bitlines are at zero or low bias ($V_{dd}$), GIDL, SSI and SHEI should not occur on unselected bitlines. However, there does exist a need to ensure that $V_{pgm}$ and $V_{pass}$ are low enough to prevent $V_{pass}$ disturbances due to tunneling.

Figure 4:
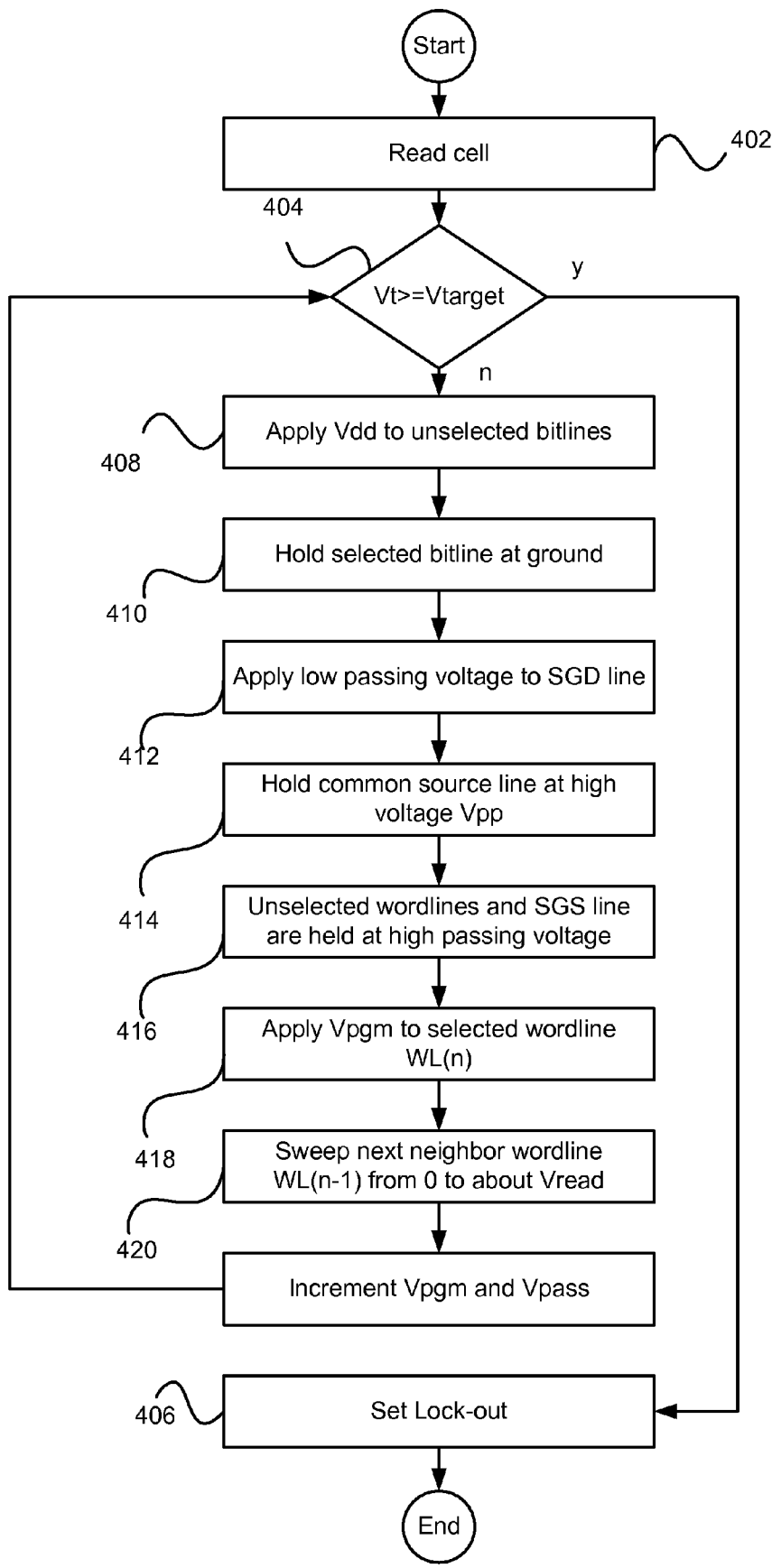
FIG. 4 shows a flowchart illustrating a low voltage method of programming a non-volatile memory cell in accordance with an embodiment of the present invention.

FIG. 4 shows a flowchart illustrating a method of programming non-volatile memory cell located on a wordline WL(n) using a next neighbor wordline WL(n–1) as a hot carrier injector using source side injection (SSI) in accordance with an embodiment of the invention. It should be noted that SSI is a method of programming whereby electrons are injected from the drain of one transistor into the gate above the source of an adjacent transistor. In the described embodiment, the cell to be programmed is first subjected to a read operation 402. During the read operation, the threshold voltage of the memory cell is verified. In step 404 it is then determined whether or not a target verification voltage level, $V_{target}$, is reached. If the threshold voltage of the memory cell is greater than or equal to $V_{target}$, the cell is locked-out in step 406. If the threshold voltage is less than $V_{target}$, then in step 408 unselected bitlines are held at $V_{dd}$ while, in step 410, the selected bitline is grounded. In step 412, the SGD line is held at low passing voltage $V_{passL}$ (about 2V), while, in step 414, the source line is held at $V_{pp}$ (about 5V). In step 416, unselected wordlines and SGS line are held at a high passing voltage, $V_{passH}$ (about 8V), and at step 418, a high positive program voltage, $V_{pgm}$, is applied to the control gate of the selected memory cell by biasing wordline WL(n) and at step 420 next neighbor wordline WL(n–1) is swept from about 0V to about $V_{read}$. In this manner, the floating gate of the selected cell on wordline WL(n) serves as a collector of electrons and the next neighbor wordline WL(n–1) serves as the injector. Next, $V_{pgm}$ and $V_{pass\_x}$ (both $V_{passH}$ and $V_{passL}$) are incremented in step 422 and the process is repeated until the condition 404 is satisfied. It should be noted that sample bias conditions include: $V_{pgm}$ ranges from about 8V to about 14V, $V_{passL}$ ranges from about 4V to about 10V, $V_{passH}$ ranges from about 5V to about 10V, $V_{pp}$ ranges from about 3.5V to about 5.5V, and $V_{dd}$ ranges from about 1.8V to about 3.6V.

Figure 5:
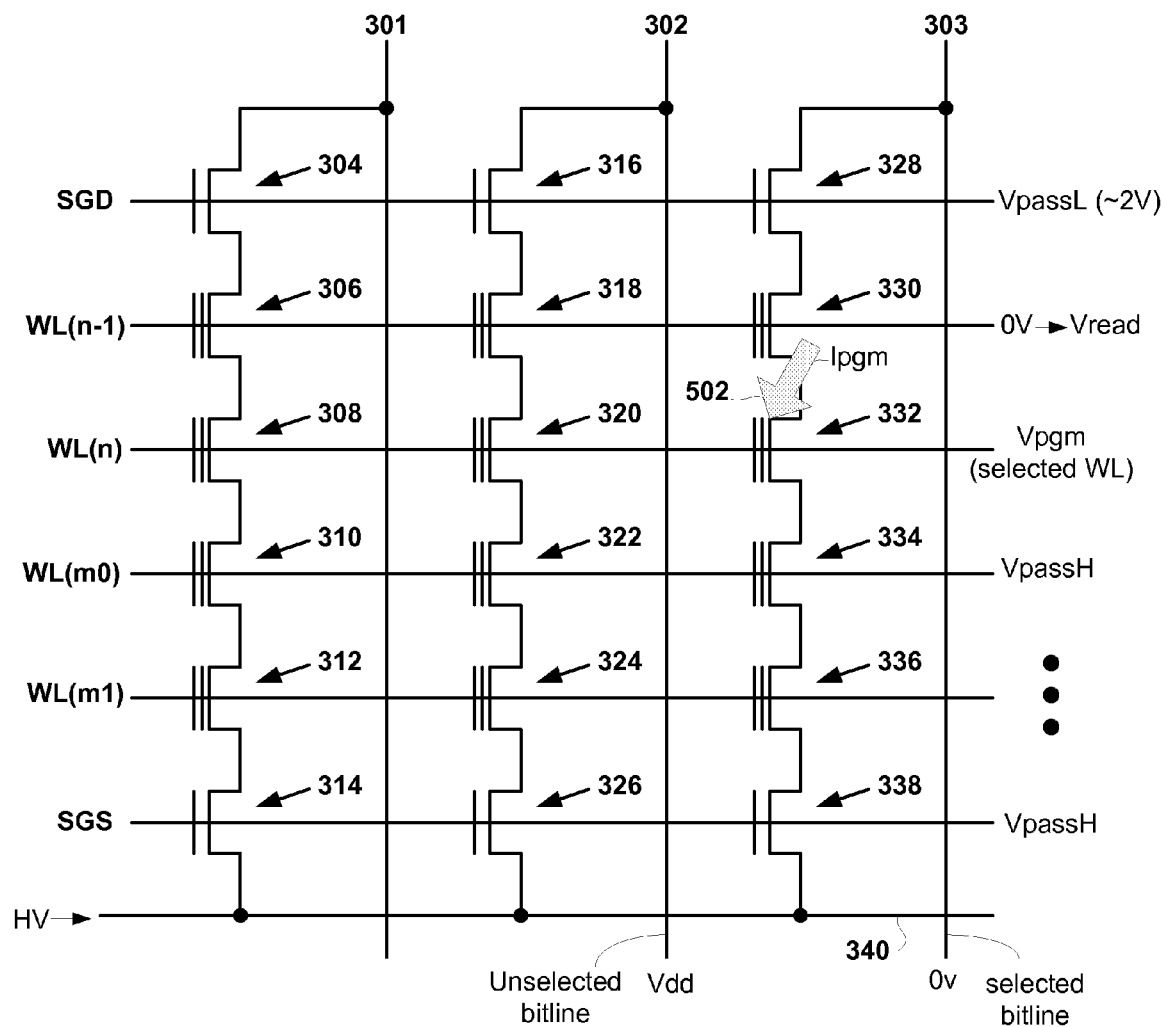
FIG. 5 shows a schematic representation of the programming described in FIG. 4.

The bias conditions described with respect to the embodiment described with regards to process 400 above for next neighbor wordline WL(n–1) programming are illustrated in FIG. 5, where a selected memory cell 332 on WL(n) is being programmed by electrons provided by memory cell 330 on next neighbor wordline WL(n–1). Adjacent to the cell 330 are a select gate drain 328 connected to an SGD line on which voltage VSGD is applied. The arrow 502 indicates the direction the electrons that constitute programming current $I_{pgm}$ are traveling. When the word line WL(n–1) is ramped from 0 to $V_{read}$, a conducting channel of electrons is created between its source and drain. The large $V_{pgm}$ applied to the control gate of cell 332 causes electrons in the source of memory cell 330 to be injected into the floating gate of the cell 332.

FIG. 6 illustrates a representative low voltage programming bias voltage values in accordance with the embodiment of the invention described in FIGS. 4 and 5.

Figure 7:
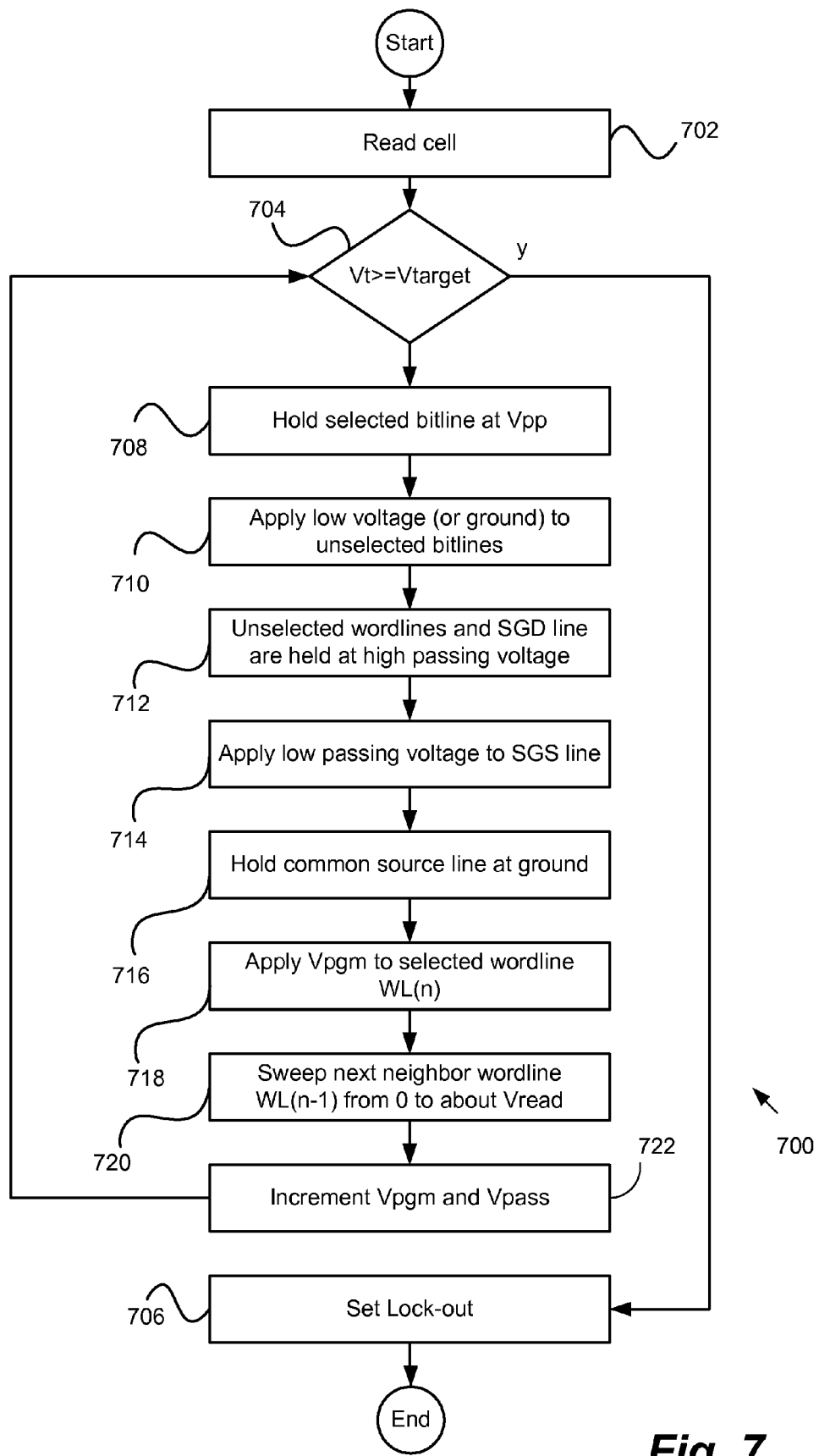
FIG. 7 shows a flowchart illustrating a method of programming non-volatile memory cell located on a wordline WL(n) using a next neighbor wordline WL(n−1) as a hot carrier injector using source side injection (SSI) in accordance with an embodiment of the invention.

FIG. 7 shows a flowchart illustrating a method of programming non-volatile memory cell located on a wordline WL(n) using a next neighbor wordline WL(n–1) as a hot carrier injector using source side injection (SSI) in accordance with an embodiment of the invention. It should be noted that the "S" in "SSI" actually refers to the "source region of WL(n)" which happens to be the same electrical node as the "drain region of WL(n–1). In the described embodiment, the memory cell to be programmed is first subjected to a read operation 702. During the read operation, the threshold voltage of the memory cell is verified. In step 704 it is then determined whether or not a target verification voltage level, $V_{target}$, is reached. If the threshold voltage of the memory cell is greater than or equal to $V_{target}$, the cell is locked-out in step 706. If the threshold voltage is less than $V_{target}$, then in step 708 the selected bitline is held at $V_{pp}$ at step 710, unselected bitlines are held at ground or other low voltage $V_{dd}$ and at 712, unselected wordlines and SGD line are held at a high passing voltage, $V_{passH}$ (about 8V). In step 714, the SGS line is held at low passing voltage $V_{passL}$ (about 2V) while, in step 716, the source line is held at ground and at step 718, a high positive program voltage, $V_{pgm}$, is applied to the control gate of the selected memory cell by biasing wordline WL(n) and at step 720 next neighbor wordline WL(n–1) is swept from about 0V to about $V_{read}$. In this manner, the floating gate of the selected cell on wordline WL(n) serves as a collector of electrons and the next neighbor wordline WL(n–1) serves as the injector.

Next, $V_{pgm}$ and $V_{pass\_x}$ (both $V_{passH}$ and $V_{passL}$) are incremented in step 722 and the process is repeated until the condition 704 is satisfied.

Figure 8:
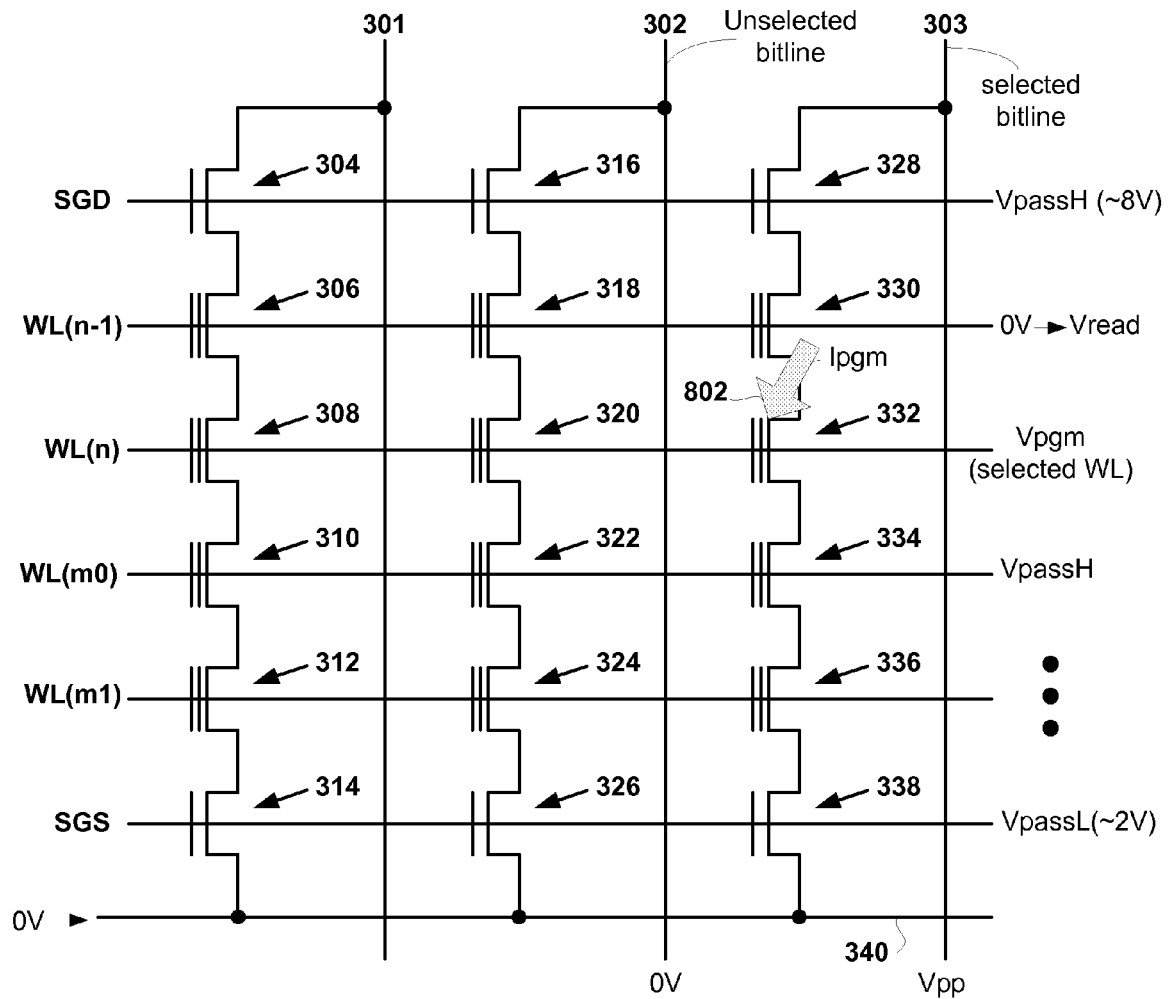
FIG. 8 shows a schematic representation of the programming described in FIG. 7.

The bias conditions described with respect to the embodiment described with regards to process 800 above for next neighbor wordline WL(n−1) programming are illustrated in FIG. 8, where the selected memory cell 332 on WL(n) is being programmed by electrons provided by memory cell 330 on next neighbor wordline WL(n−1). The arrow 802 indicates the direction the electrons that constitute programming current $I_{pgm}$ are traveling. As above with regards to the process 400, when the word line WL(n−1) is ramped from 0 to $V_{read}$, a conducting channel of electrons is created between its source and drain. The large $V_{pgm}$ applied to the control gate of cell 332 causes electrons in the source of memory cell 330 to be injected into the floating gate of the cell 332.

It should be noted that other biasing schemes for programming with SSI are well known in the art and are permitted as well. For example, there are boost-based schemes for boosting the channel voltage in a selected memory cell. In such schemes, the selected wordline is often biased to Vdd while unselected wordlines are biased with a voltage, Vboost, which is greater than Vpass. Such boosting schemes take advantage of the channel capacitance of unselected cells. Hence, the strength of boosting increases as the number of wordlines increases and scales down as the device geometries scale down. Alternatively, the much larger BL capacitance can be used to provide the boost.

Figure 9B:
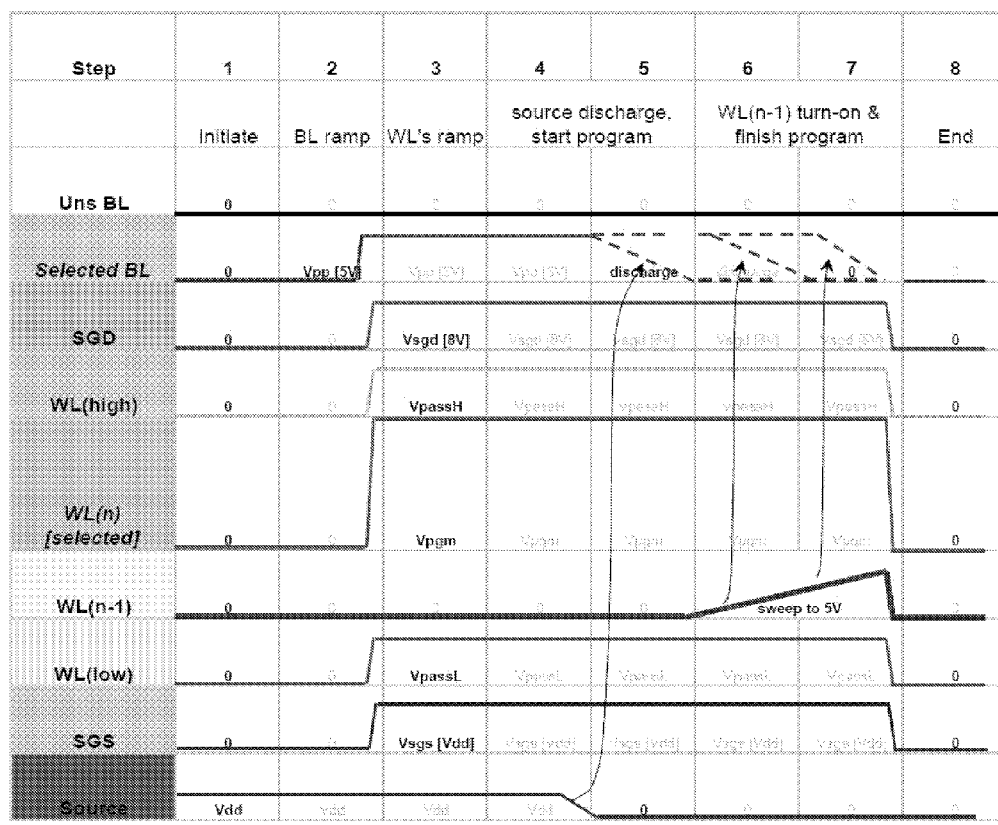

FIGS. 9A and 9B illustrates representative low voltage programming waveforms and corresponding bias voltages in accordance with the embodiment of the invention described with regards to FIGS. 7 and 8.

It should be additionally noted that SSI is very efficient in generating hot electrons in the channel of the selected transistor receiving the electrons and also provides very high efficiency in collecting these channel hot electrons into the floating gate. SSI also requires significantly less current than other modes of programming, improves reliability and allows for re-programming using on-chip charge pumps. Furthermore, by using a next neighbor word line as an injector, the programming voltage Vpgm is reduced over conventional FN programming methods, the channel voltage Vpp is reduced, there is no change in already existing NAND architecture, there is no reliance on tunnel oxide scaling, and any of a number of programming protocols are available.

Although only a few embodiments of the invention have been described in detail, it should be appreciated that the invention may be implemented in many other forms without departing from the spirit or scope of the invention. Although specific features and conditions have been described, it should be appreciated that a wide variety of implementations, such as bias conditions and method combinations, may be modified and employed as well. In addition, although in physical construction the present invention is applied to a conventional non-volatile memory system without modification, it should be appreciated by one skilled in the art that the structure could be modified to enhance the effects of the present invention. Accordingly, the present embodiments are to be considered as illustrative and not restrictive and the invention is not to be limited to the details given herein, but may be modified within the scope of the appended claims.

Figure 10:
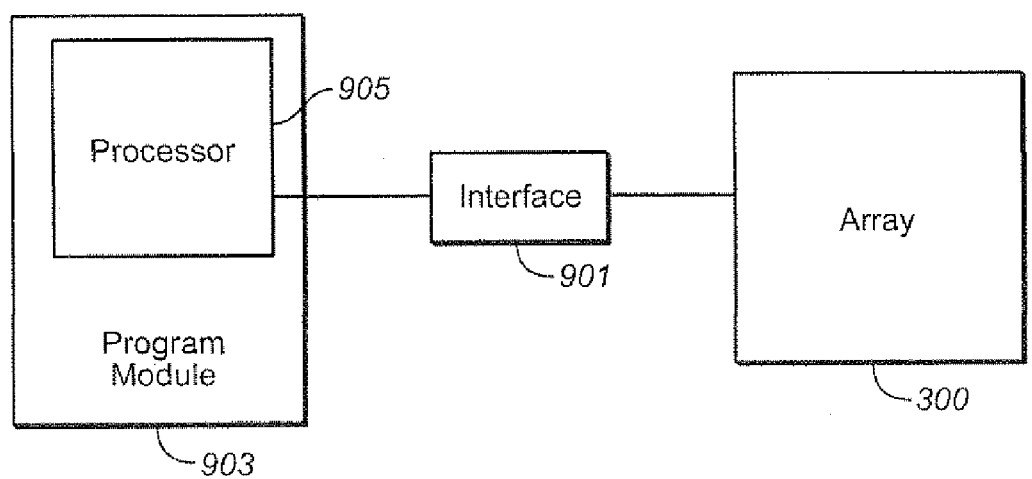
FIG. 10 illustrates an example of a system for providing low voltage programming.

FIG. 10 illustrates an example of a system for providing low voltage programming of a selected non-volatile memory cell in a memory array 300 having a gate node coupled to a wordline WL(n) and a drain node connected to a selected bitline. The system includes a programming module 903, an interface 901 arranged to electrically couple the memory array 300 to the programming module, and a processor 905 included in the programming module 903 and electrically coupled to the interface 901 for executing programming instructions that cause hot carriers to be injected from a drain region of an injecting memory cell having a gate node coupled to a next neighbor wordline WL(n−1) into a floating gate of the selected non-volatile memory cell on the wordline WL(n).

The invention claimed is:

1. A system for providing low voltage programming of a selected non-volatile memory cell in a memory array having a gate node coupled to a wordline WL(n) and a drain node connected to a selected bitline, comprising:
   a programming module;
   an interface arranged to electrically couple the memory array to the programming module; and
   a processor included in the programming module and electrically coupled to the interface to execute programming instructions: (a) causing hot carriers to be injected from a drain region of an injecting memory cell having a gate node coupled to a next neighbor wordline WL(n−1) into a floating gate of the selected non-volatile memory cell on the wordline WL(n).

2. A system as recited in claim 1, wherein the programming instructions include computer code executable by the processor for:
   (b) determining a threshold voltage of the selected non-volatile memory cell; and
   (c) locking out the non-volatile memory cell if the threshold voltage is greater than an target threshold voltage.

3. A system as recited in claim 2 wherein the programming instructions further include computer code executable by the processor for,
   holding the selected bitline at ground;
   applying $V_{dd}$ to all unselected bitlines;
   applying low passing voltage $V_{passL}$ to a drain select gate (SGD) line;
   applying $V_{pp}$ to common source line;
   applying a high passing voltage $V_{passH}$ to all unselected wordlines except for the next neighbor word line WL(n−1);
   applying the high passing voltage $V_{passH}$ to a source gate select (SGS) line;
   applying $V_{pgm}$ to the selected word line WL(n); and
   sweeping a next neighbor word line WL(n−1) gate node voltage from about 0 V to about a $V_{read}$, when the threshold voltage is less than the target voltage.

4. A system as recited in claim 3, wherein the programming instructions further include computer code executable by the processor for:
   incrementing the program voltage $V_{pgm}$ and the $V_{passH}$ and $V_{passL}$ voltages; and
   returning to determining (b).

5. A system as recited in claim 3, wherein $V_{pgm}$ ranges from about 8V to about 14V, $V_{passL}$ ranges from about 4V to about 10V, $V_{passH}$ ranges from about 5V to about 10V, $V_{pp}$ ranges from about 3.5V to about 5.5V, and $V_{dd}$ ranges from about 1.8V to about 3.6V.

6. A system as recited in claim 2 wherein the programming instructions further include computer code executable by the processor for,
   holding the selected bitline at $V_{pp}$;
   grounding to all unselected bitlines;
   applying high passing voltage $V_{passH}$ to a drain select gate (SGD) line and unselected wordlines except for the next neighbor wordline WL(n−1);

applying low passing voltage $V_{passL}$ to SGS line;
grounding common source line;
applying $V_{pgm}$ to the selected word line WL(n); and
sweeping a next neighbor word line WL(n–1) gate node voltage from about 0 V to about a $V_{read}$ when the threshold voltage is less than the target voltage.

7. A system as recited in claim 5, wherein the programming instructions further include computer code executable by the processor for,
incrementing the program voltage Vpgm and the VpassH and VpassL voltages; and
returning to determining (b).

8. A system as recited in claim 6, wherein $V_{pgm}$ ranges from about 8V to about 14V, $V_{passL}$ ranges from about 4V to about 10V, $V_{passH}$ ranges from about 5V to about 10V, $V_{pp}$ ranges from about 3.5V to about 5.5V, and $V_{dd}$ ranges from about 1.8V to about 3.6V.

9. A low voltage method as recited in claim 1, wherein the memory array is a NAND type memory array.

10. A system for providing low voltage programming of a selected non-volatile memory cell in a memory array having a gate node coupled to a wordline WL(n) and a drain node connected to a selected bitline, comprising:
a programming module;
an interface arranged to electrically couple the memory array to the programming module; and
a processor included in the programming module and electrically coupled to the interface to execute programming instructions only if a threshold voltage of the selected non-volatile memory cell is less than a target threshold voltage where the programming instructions include holding the selected bitline at ground, applying $V_{dd}$ to all unselected bitlines; applying low passing voltage $V_{passL}$ to a drain select gate (SGD) line, applying $V_{pp}$ to common source line, applying a high passing voltage $V_{passH}$ to all unselected wordlines except for the next neighbor word line WL(n–1), applying the high passing voltage $V_{passH}$ to a source gate select (SGS) line, applying $V_{pgm}$ to the selected word line WL(n), and sweeping a next neighbor word line WL(n–1) gate node voltage from about 0V to about a $V_{read}$ thereby causing hot carriers to be injected from a drain region of an injecting memory cell having a gate node coupled to a next neighbor wordline WL(n–1) into a floating gate of the selected non-volatile memory cell on the wordline WL(n), otherwise, if the threshold voltage is greater than a target threshold voltage, the non-volatile memory cell is locked out.

11. A system as recited in claim 10, wherein the programming instructions further include incrementing the program voltage $V_{pgm}$ and the $V_{passH}$ and $V_{passL}$ voltages, and
continuing the programming of the non-volatile memory cell if the threshold voltage is less than the target threshold voltage.

12. A system as recited in claim 11, wherein $V_{pgm}$ ranges from about 8V to about 14V, $V_{passL}$ ranges from about 4V to about 10V, $V_{passH}$ ranges from about 5V to about 10V, $V_{pp}$ ranges from about 3.5V to about 5.5V, and $V_{dd}$ ranges from about 1.8V to about 3.6V.

13. A system as recited in claim 10, wherein the memory array is a NAND type memory array.

14. A system for providing low voltage programming of a selected non-volatile memory cell in a memory array having a gate node coupled to a wordline WL(n) and a drain node connected to a selected bitline, comprising:
a programming module;
an interface arranged to electrically couple the memory array to the programming module; and
a processor included in the programming module and electrically coupled to the interface to execute programming instructions only if a threshold voltage of the selected non-volatile memory cell is less than a target threshold voltage, where the programming instructions include holding the selected bitline at $V_{pp}$, grounding to all unselected bitlines, applying high passing voltage VpassH to a drain select gate (SGD) line and unselected wordlines except for the next neighbor wordline WL(n–1), applying low passing voltage $V_{passL}$ to SGS line; grounding common source line, applying $V_{pgm}$ to the selected word line WL(n), and sweeping a next neighbor word line WL(n–1) gate node voltage from about 0 V to about a $V_{read}$ when the threshold voltage is less than the target voltage thereby causing hot carriers to be injected from a drain region of an injecting memory cell having a gate node coupled to a next neighbor wordline WL(n–1) into a floating gate of the selected non-volatile memory cell on the wordline WL(n), otherwise, if the threshold voltage is greater than an target threshold voltage, the non-volatile memory cell is locked out.

15. A system as recited in claim 14, wherein the programming instructions further include incrementing the program voltage $V_{pgm}$ and the $V_{passH}$ and $V_{passL}$ voltages, and
continuing the programming of the non-volatile memory cell if the threshold voltage is less than the target threshold voltage.

16. A system as recited in claim 15, wherein $V_{pgm}$ ranges from about 8V to about 14V, $V_{passL}$ ranges from about 4V to about 10V, $V_{passH}$ ranges from about 5V to about 10V, $V_{pp}$ ranges from about 3.5V to about 5.5V, and $V_{dd}$ ranges from about 1.8V to about 3.6V.

17. A system as recited in claim 14, wherein the memory array is a NAND type memory array.

* * * * *